United States Patent
Goto

[11] Patent Number: 5,902,121
[45] Date of Patent: May 11, 1999

[54] SEMICONDUCTOR DEVICE AND METHOD FOR MANUFACTURING SEMICONDUCTOR DEVICE

[75] Inventor: Hiroshi Goto, Kawasaki, Japan

[73] Assignee: Fujitsu Limited, Kawasaki, Japan

[21] Appl. No.: 08/877,201

[22] Filed: Jun. 17, 1997

Related U.S. Application Data

[62] Division of application No. 08/363,517, Dec. 23, 1994, Pat. No. 5,691,561.

[30] Foreign Application Priority Data

Feb. 18, 1994 [JP] Japan .................................. 6-21172

[51] Int. Cl.$^6$ .................................................. H01L 29/72
[52] U.S. Cl. ...................... 438/199; 438/218; 438/230; 438/231; 438/233; 438/303; 438/592; 438/655; 438/694; 257/369; 257/408
[58] Field of Search ........................ 257/369, 408; 438/218, 230, 231, 233, 303, 592, 655, 694

[56] References Cited

U.S. PATENT DOCUMENTS

| | | |
|---|---|---|
| 4,384,301 | 5/1983 | Tasch, Jr. et al. . |
| 4,545,116 | 10/1985 | Lau . |
| 4,657,628 | 4/1987 | Holloway et al. . |
| 4,675,073 | 6/1987 | Douglas . |
| 4,793,896 | 12/1988 | Douglas . |
| 4,804,636 | 2/1989 | Groover, III et al. . |
| 4,821,085 | 4/1989 | Haken et al. . |
| 4,863,559 | 9/1989 | Douglas . |
| 4,890,141 | 12/1989 | Tang et al. . |
| 4,957,590 | 9/1990 | Douglas . |
| 4,975,756 | 12/1990 | Haken et al. . |
| 4,980,020 | 12/1990 | Douglas . |
| 5,010,032 | 4/1991 | Tang et al. . |
| 5,122,225 | 6/1992 | Douglas . |
| 5,190,893 | 3/1993 | Jones, Jr. et al. . |
| 5,759,885 | 6/1998 | Son ........................................ 438/199 |

FOREIGN PATENT DOCUMENTS 2-2139  1/1990  Japan .

OTHER PUBLICATIONS

"Titanium Nitride Local Interconnect Technology for VLSI", Tang et al, IEEE Transactions on Electron Devices, vol. ED.–34, No. 3, Mar. 1987, pp. 682–688.

"A High–Performance 0.25–$\mu$m CMOS Technology: I –Design and Characterization", Chang et al, IEEE Transactions on Electron Devices, vol. 39, No. 4, Apr. 1992, pp. 959–966.

"A High–Performance 0.25–$\mu$m CMOS Technology: II–Technology", Davari et al, IEEE Transactions on Electron Devices, vol. 39, No. 4, Apr. 1992, pp. 967–975.

*Primary Examiner*—Edward Wojciechowicz
*Attorney, Agent, or Firm*—Nikaido, Marmelstein, Murray & Oram LLP

[57] ABSTRACT

The present invention relates to a semiconductor device having complementary field effect transistors and a method for manufacturing the same. The object of the present invention is to provide a semiconductor device and a method for manufacturing the same in which is decreased the silicide formation area for connecting a p-type impurity region and an n-type impurity region in the dual gate structure. It comprises steps of covering the silicide formation area of a semiconductor layer with an oxidation resisting sidewall formed in a self-aligned fashion, ion-implanting p-type and n-type impurities with the oxidation resisting sidewall as a mask, patterning the semiconductor layer to form a dual gate pattern, oxidizing a surface of the dual gate pattern with the oxidation resisting sidewall as a mask, selectively removing the oxidation resisting sidewall, and followed by making silicide at its surface exposed by the removal of the oxidation resisting sidewall.

14 Claims, 9 Drawing Sheets

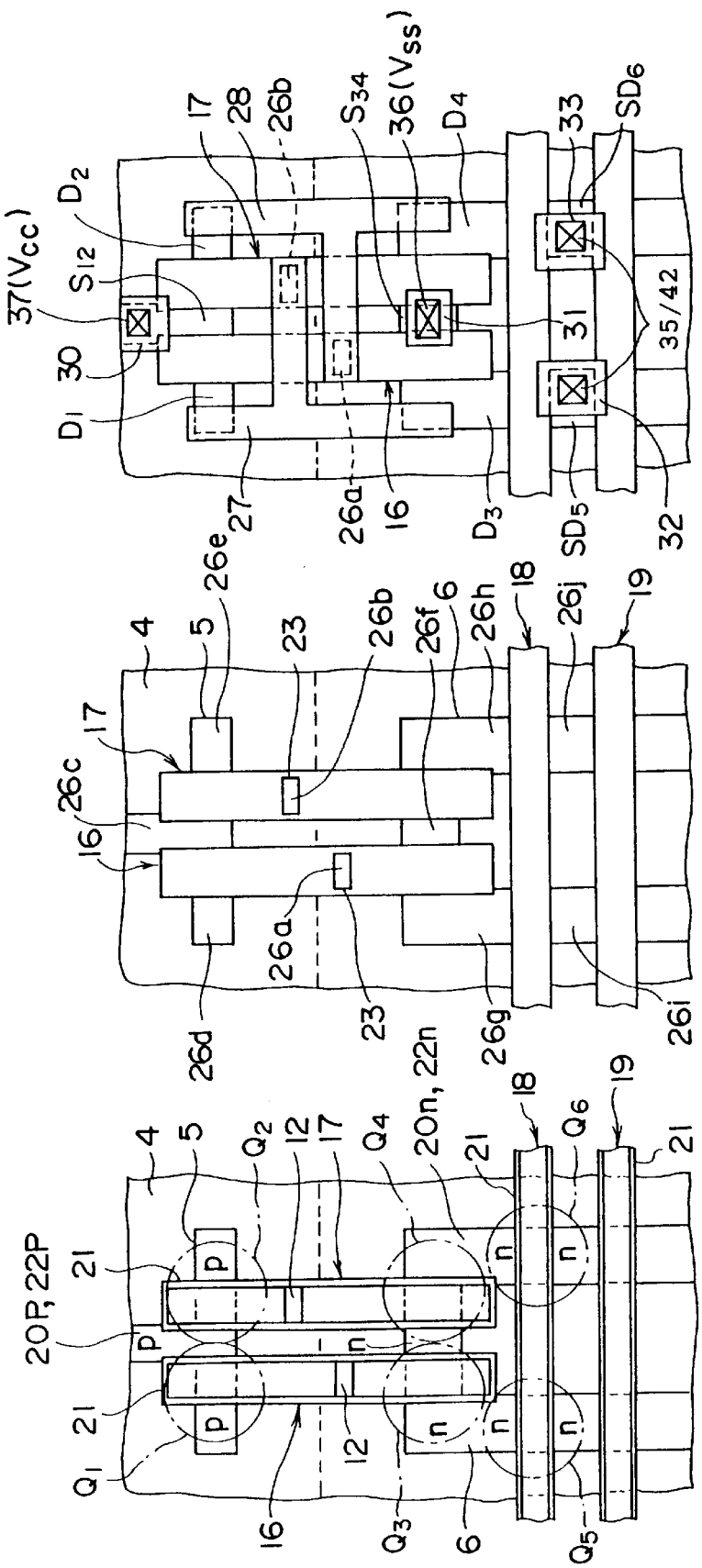

SEMICONDUCTOR DEVICE AND METHOD FOR MANUFACTURING SEMICONDUCTOR DEVICE

This is a division of application Ser. No. 08/363,517 filed Dec. 23, 1994 now U.S. Pat. No. 5,691,561.

BACKGROUND OF THE INVENTION

1. Field of the Invention

The present invention relates to a semiconductor device having complementary field effect transistors and a method for manufacturing the same.

2. Description of the Prior Art

FIG. 1 is a circuit diagram illustrating an example of SRAMs comprising six MOS transistors.

Namely, the SRAM includes two CMOS invertors comprising p-channel load transistors $Q_1$ and $Q_2$ and n-channel drive transistors $Q_3$ and $Q_4$ respectively.

The gates of the p-channel load transistor $Q_1$ and the n-channel drive transistor $Q_3$ forming one of the CMOS invertors are connected to the drain of the n-channel drive transistor $Q_4$ of the other of the CMOS invertors respectively. Also, the gates of the p-channel load transistor $Q_2$ and the n-channel drive transistor $Q_4$ forming the other of the CMOS invertors are connected to the drain of the n-channel drive transistor $Q_3$ of the one of the CMOS invertors respectively in the same manner. Furthermore, the drains of the two drive transistors $Q_3$ and $Q_4$ are connected respectively to a bit line BL and an inverted bit line $\overline{BL}$ through the two source/drains of n-channel transfer transistors $Q_5$ and $Q_6$. The term "source/drain" designates an appropriate element functioning as either of a source and a drain and is utilized hereinbelow in this sense.

Furthermore, a voltage Vcc is applied to the sources of the two p-channel load transistors $Q_1$ and $Q_2$ while a voltage Vss is applied to the sources of the two drive transistors $Q_3$ and $Q_4$. The gates of the two transfer transistors $Q_5$ and $Q_6$ are connected to a word line WL.

The horizontal configuration of the above SRAM is described, for example, in (1) THOMAS E. TANG et al., IEEE TRANSACTIONS ON ELECTRON DEVICES, Vol.ED-34, No.3, March 1987, pp.682–688.

The semiconductor device described therein comprises first and second p-type transistors $T_1$ and $T_2$, serving as the load transistors $Q_1$ and $Q_2$, formed within an approximately "C"-shaped first active region 101 and first to forth n-type transistors $T_3$ to $T_6$, serving as the drive transistors $Q_3$ and $Q_4$ and the transfer transistors $Q_5$ and $Q_6$, formed within the four straight portions of "L"-shaped second and third active regions 102 and 103 as illustrated in FIG. 2.

The gate electrodes of the first p-type transistor $T_1$ and the first-n-type transistor $T_3$ are formed from a first conductive pattern 104 serving as a interconnection. Also, the gate electrodes of the second p-type transistor $T_2$ and the second n-type transistor $T_4$ are formed from a second conductive pattern 105 serving as a interconnection.

The drain region of the first p-type transistor $T_1$ is connected to the drain region of the first n-type transistor T3 through a third conductive pattern 106. Furthermore, the drain regions of the second p-type transistor $T_2$ and the second n-type transistor $T_4$ are connected to each other through a fourth conductive pattern 107.

A couple of CMOS invertors are thus formed by this configuration.

Also, a interconnection 104 *a* extending from the first conductive pattern 104 is connected to the fourth conductive pattern 107. Furthermore, the second conductive pattern 105 is connected to the third conductive pattern 106 in the same manner. The CMOS invertors are cross-coupled by this structure. The word line WL passing through the second and third active regions 102 and 103 serves also as the gate electrodes of third and fourth n-type transistors $T_5$ and $T_6$.

Meanwhile, p-type impurity diffusion layers are formed in the both sides of the gate electrodes within the first active region 101, and n-type impurity diffusion layers are formed in the both sides of the gate electrodes within the second active region 102 and the third active region 103. Furthermore, the source/drain regions of the third and fourth n-type transistors $T_5$ and $T_6$, which are not connected to the first and second n-type transistors $T_3$ and $T_4$, are connected to bit lines which are not shown in this figure.

In the technical field, it has been attempted to fabricate the first p-type transistors $T_1$ and $T_2$ as surface channel type transistors in order to suppress the short channel effect of the p-type transistors $T_1$ and $T_2$. In this case, the gate electrodes of the p-type transistors $T_{1\ and\ T2}$ are usually formed of a p-type impurity doped silicon.

Accordingly, the gate electrode for making connection between a p-type transistor and an n-type transistor is formed as a dual gate structure comprising a p-type impurity diffusion region and an n-type impurity diffusion region formed in a silicon layer. These regions have to be connected by means of a metallic material or silicide on the both sides of the boundary between the p-type impurity diffusion region and the n-type impurity diffusion region. To this end, a p-type impurity and an n-type impurity are introduced in a separate manner and the p-type impurity diffusion region and the n-type impurity diffusion region are connected by means of silicide.

The dual gate structure is described in (2) Wen-Hsing Chang et al., IEEE TRANSACTIONS ON ELECTRON DEVICES, Vol. 39, No. 4, APRIL 1992, pp. 959–966 and (3) Bijan Davari et al., IEEE TRANSACTIONS ON ELECTRON DEVICES, Vol. 39, No. 4, APRIL 1992, pp. 967–975.

However, in order to improve the integration level of semiconductor devices, it is required to decrease the area of the silicide at the boundary in the dual gate structure for fining the dual gate structure much more. This has not been discussed yet.

Meanwhile, as fining semiconductor devices, the accuracy of alignment of contact holes, through which connection of bit lines and interconnections for supplying electric power is made, must be improved. The margin of the alignment may be procured, for example, by providing pad layers on the source regions and the drain regions of MOS transistors, on which connection to bit lines and power lines is made by the so-called self-aligned contact. This technique is described in (4) Japanese Patent Published Application No.Hei2-2139 corresponding to U.S. patent application Ser. No.128,834, filed on Dec. 4, 1987.

However, it is not permitted to grow a metallic film for providing the pad layer in the position of an opening described in the document (4) in the condition that the above described silicide layer is exposed at the surface of the gate because short current paths are formed among the gate and the source/drain.

SUMMARY OF THE INVENTION

It is an object; of the present invention to provide a semiconductor device and a method for manufacturing the same with a dual gate structure in which a pad layer can be formed under an opening for making connection with power lines and bit lines without forming a short current path while decreasing the silicide formation area for connecting a p-type impurity region and an n-type impurity region.

In accordance with the present invention, the silicide formation area of a semiconductor layer is covered with an oxidation resisting sidewall with which, as a mask, p-type and n-type impurities are ion-implanted in separate steps. A dual gate pattern is then formed by patterning the semiconductor layer followed by oxidation of the dual ate pattern with the oxidation resisting sidewall as a mask. After selectively removing the oxidation resisting sidewall, the semiconductor layer is made silicide at its surface exposed by the removal of the oxidation resisting sidewall.

Accordingly, in the dual gate structure, the miniaturization of SRAM cells becomes possible by the reduction of the dual gate in size since the area to be made silicide is substantially narrowed.

In addition to this, the oxidation resisting self-aligned sidewall is utilized as part of a mask for selectively implanting impurities into the semiconductor layer and as part of an oxidation resisting mask for partially thermal oxidizing the surface of the semiconductor layer. Because of this, the throughput is substantially improved as compared with the case of the formation of the mask by means of photolithography.

Also, in accordance with another aspect of the present invention, it is carried out by patterning a conductive film to form contact pads located in the area where contact holes are formed and the interconnections to be connected to the silicide layers appearing at the surface of the dual gate patterns of the MOS transistors. In this case, since the silicide layers are located apart from the contact pads, it becomes possible to prevent the formation of a short circuit connecting them and to dispense with an additional process for forming the contact pads.

BRIEF DESCRIPTION OF THE DRAWINGS

FIGS. 3A through 3F are cross sectional views showing a method of manufacturing SRAM cells provided with dual gates in accordance with a first embodiment of the present invention.

DETAILED DESCRIPTION OF THE PREFERRED EMBODIMENTS

Figure 1:
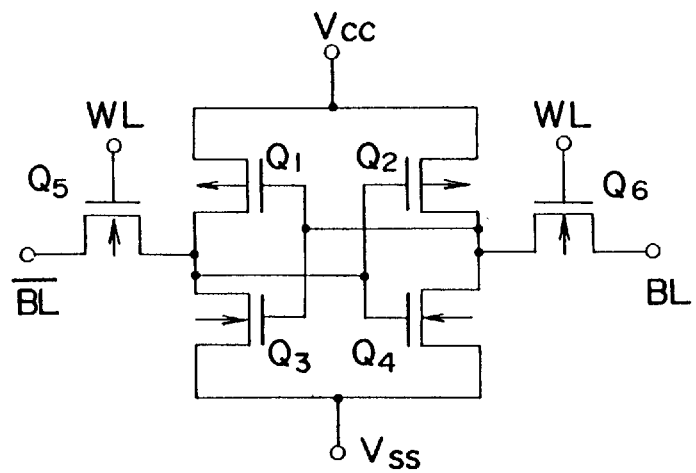
FIG. 1 is a circuit diagram showing usual SRAM cells composed of six transistors.
Figure 2:
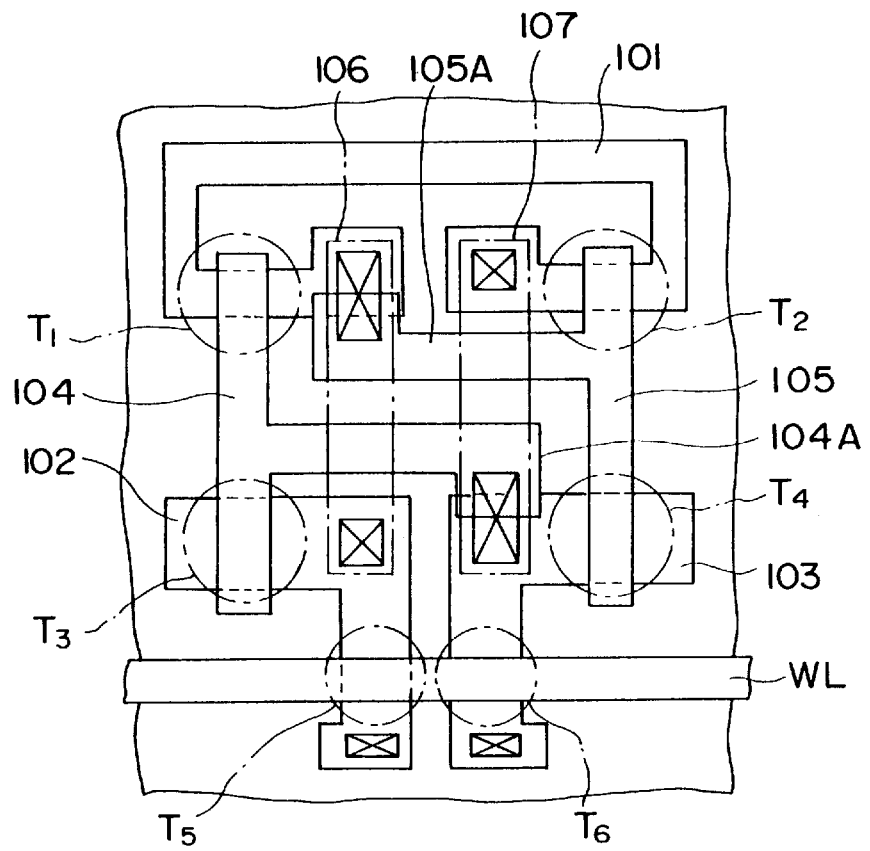
FIG. 2 is a plan view showing SRAM cells according to the prior art.

Next, methods for forming films by plasma CVD in accordance with embodiments of the present invention will be described with reference to drawings.

(First Embodiment)

A method of manufacturing an SRAM cell composed of CMOS invertors in accordance with the present invention will be described. FIGS. 3A through 3F are plan views showing the method of manufacturing SRAM cells. FIGS. 4A through 4F are cross sectional views showing the manufacturing method along I—I line of FIG. 3A. FIGS. 5A through 5F are cross sectional views showing the manufacturing method along II—II line of FIG. 3A.

The description of the manufacturing method is first directed to the steps for partitioning the surface of a semiconductor substrate into active regions in which MOS transistors are fabricated.

An N-well 2 and a P-well 3 are formed within a semiconductor substrate 1 made of silicon. A field insulating film 4 of $SiO_2$ is formed by LOCOS on the surfaces of the N-well 2 and the P-well 3. A first active region 5 having a approximately "T"-shaped top view is defined by the field insulating film 4 in the N-well 2. Also, a second active region 6 having a "U"-shaped top view is defined by the field insulating film 4 in the P-well 3. The first active region 5 and the second active region 6 are located in order that the bottom of the second active region 6 is opposed to the top of the first active region 5 with a certain distance therebetween.

In the subsequent steps described hereinbelow, a pair of p-type MOS transistors to be the load transistors $Q_1$ and $Q_2$ as illustrated in FIG. 1 are formed within the first active region 5 while four n-type MOS transistors to be the drive transistors $Q_3$ and $Q_4$ and the transfer transistors $Q_5$ and $Q_6$ as illustrated in FIG. 1 are formed within the second active region 6.

Next, the description is directed to the formation of conductive films to be the dual gate of the CMOS invertors.

Figure 4A:
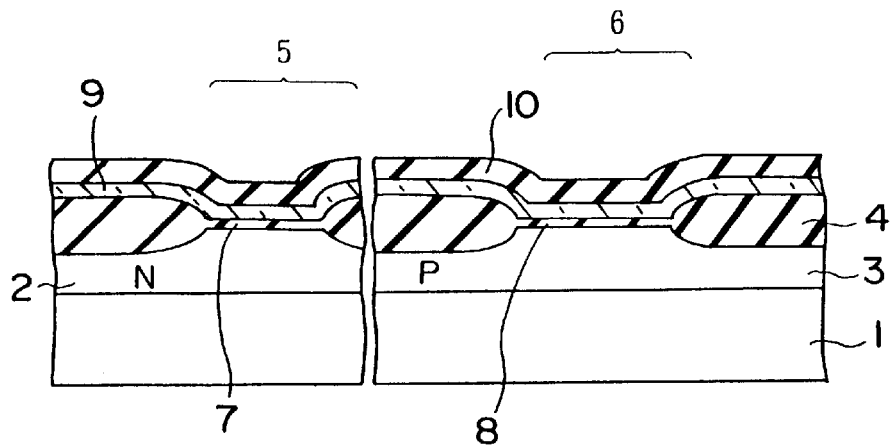
FIGS. 4A through. 4I are cross sectional views showing the manufacturing method along I—I line of FIG. 3A in accordance with the first embodiment of the present invention.

As illustrated in FIG. 4A, after cleaning the surfaces of N-well 2 in the first active region 5 and P-well 3 in the second active region 6, gate insulating films 7 and 8 made of silicon oxide are formed on the surfaces by thermal oxidation to a thickness of 50 to 100 Å.

Next, a polysilicon or amorphous silicon layer (semiconductor layer) 9 is formed by CVD to a thickness of 1500 to 2500 Å. Furthermore, a BSG (boro-silicate (glass)) film 10 is formed to a thickness of 1500 to 4000 Å. Boron is contained in the BSG film 10 as a p-type impurity with a concentration of $1\times10^{20}$ atoms/cm$^3$.

Figure 3A:
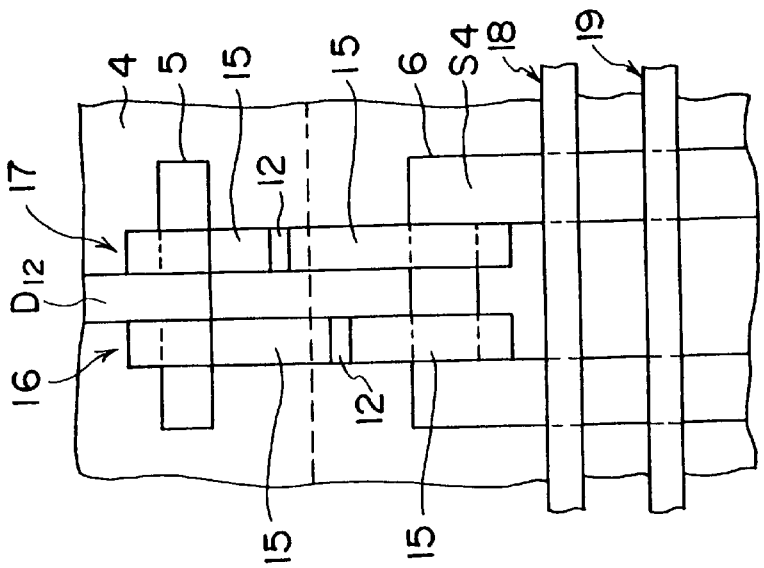
Figure 3B:
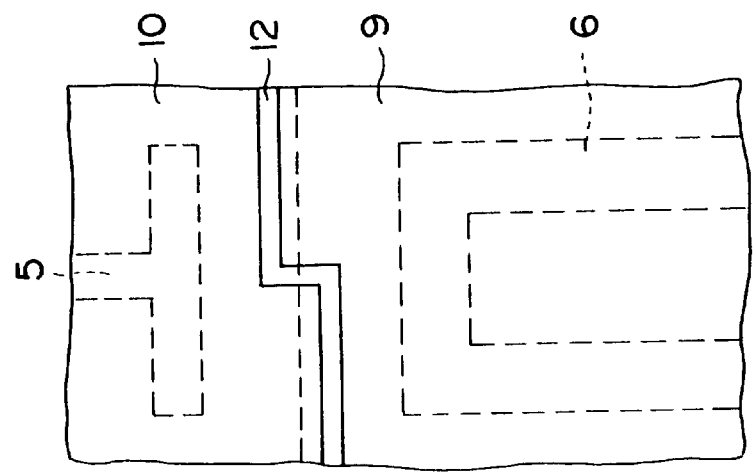

The BSG film 10 is then patterned by photolithography and removed from the P-well 3. The edge of the BSG film 10 thus patterned passes across the boundary L between the N-well 2 and the P-well 3, as illustrated in FIG. 3B, in order to form a step as seen from above.

Figure 4B:
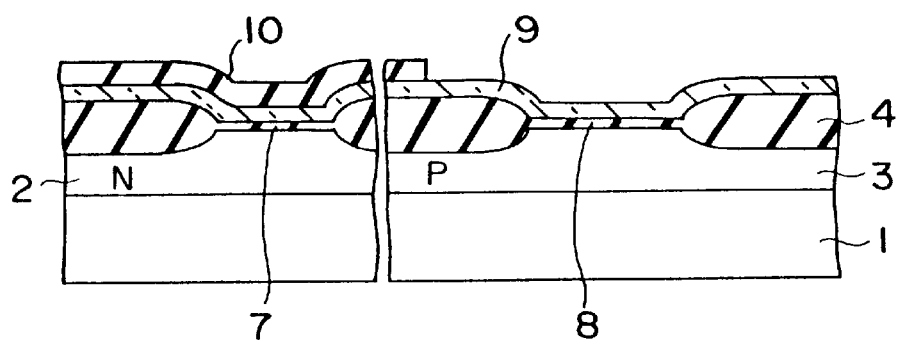
Figure 4C:
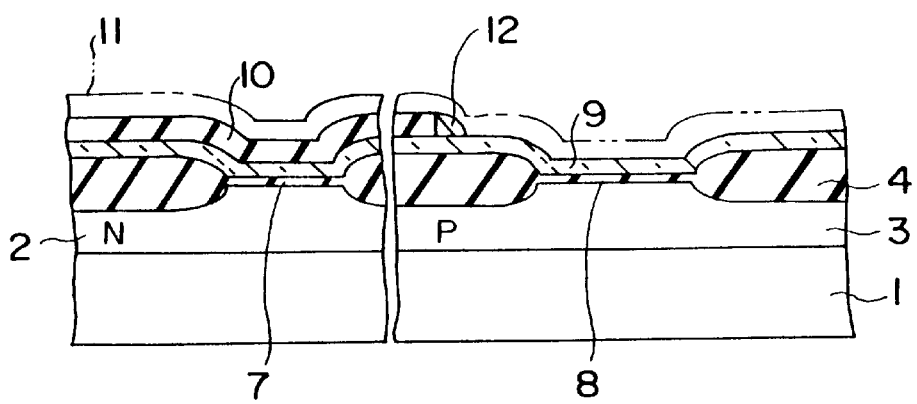

As illustrated in FIG. 4C, a silicon nitride film 11 is grown by CVD on the BSG film 10 and the silicon layer 9 to a thickness of 1000 to 2000 Å, followed by etching the silicon nitride film 11 approximately in the vertical direction by reactive ion etching (RIE). The etchant is, for example, a gas of Freon system.

By this procedure, the silicon nitride film 11 is left selectively on the side of the periphery of the BSG film 10 passing across the boundary L between the N-well 2 and the P-well 3. The silicon nitride film 11 thus left becomes an oxidation resisting and insulating sidewall 12. At the same time, the sidewall 12 has a plan view in the form of a step as illustrated in FIG. 3B.

Next, an n-type impurity such as arsenic, phosphorus, is ion-implanted into the P-well 3 of the upper portion of the silicon layer 9 with the BSG film 10 and the sidewall 12 as a mask. Furthermore, the BSG film 10 and the silicon layer 9 Are heated at about 900° C. in order to activate the n-type impurity and diffuse boron within the BSG film 10 into the silicon layer 9 underlying it. By this process, the silicon layer 9 underlying the BSG film 10 becomes a p-type impurity region 13 having an impurity density of $1\times10^{20}$ atoms/cm$^3$ while the silicon layer 9 thus ion-implanted becomes an n-type impurity region 14 having an impurity density of $1\times10^{20}$ atoms/cm$^3$. In this case, a pn junction is formed within the silicon layer 9 covered by the sidewall 12 by diffusion of the p-type impurity and the n-type impurity.

Figure 4D:
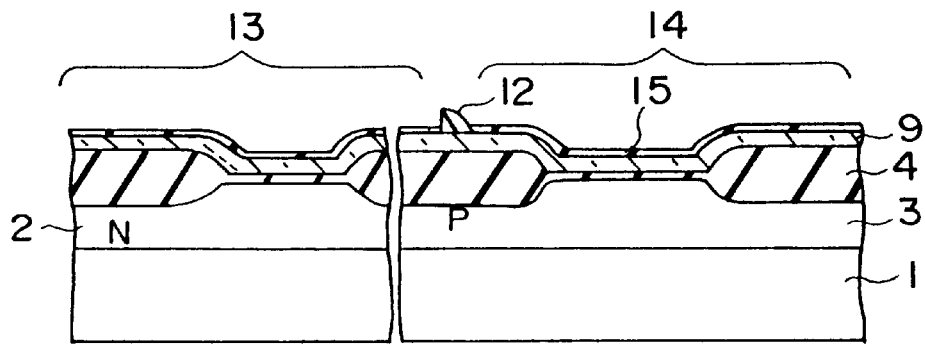

Next, after selectively removing the BSG film 10 by buffered hydrofluoric acid, a SiO$_2$ film 15 is formed on the surface of the silicon layer 9 with the sidewall 12 as an oxidation resisting mask to a thickness of 500 to 1000 Å, as illustrated in FIG. 4D. In this case, the SiO$_2$ film 15 is not formed under the sidewall 12 and therefore an opening 23 of the SiO$_2$ film 15 is formed at the same time in that space.

Meanwhile, the above described diffusion of the p-type impurity from the BSG film 10 to the silicon layer 9 may be performed at the same time as the activation of the n-type impurity in the silicon layer 9. In this case, the BSG film 10 is not removed but maintained on the silicon layer 9 as it is.

Figure 3C:
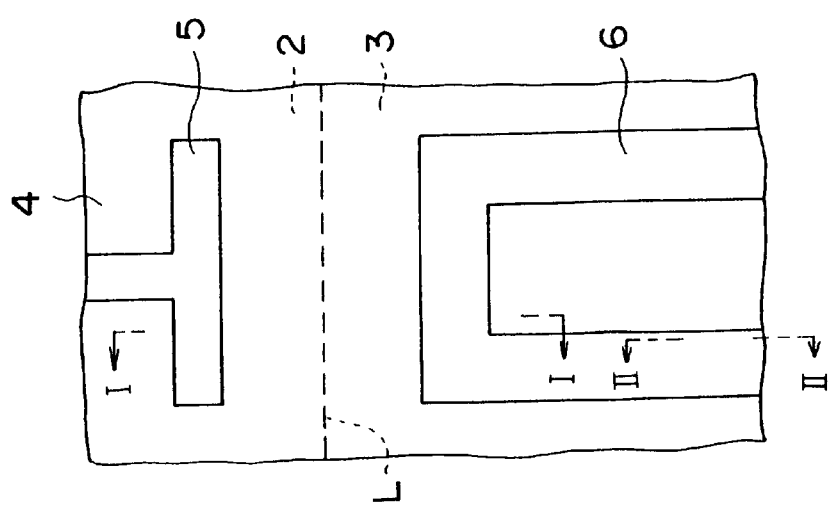
Figure 4E:
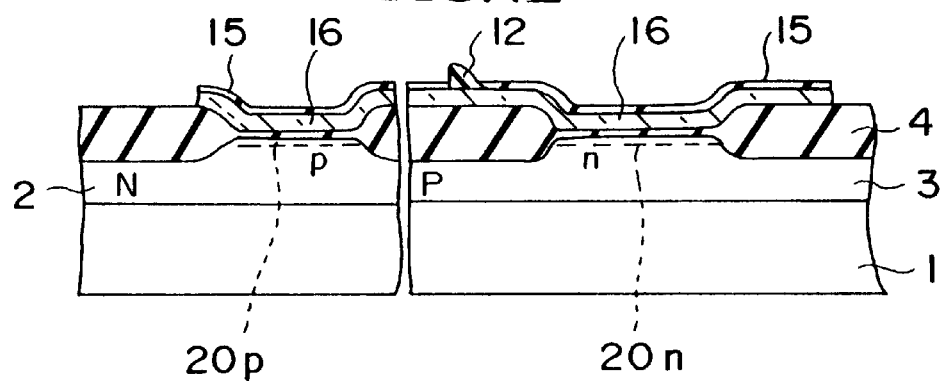
Figure 4F:
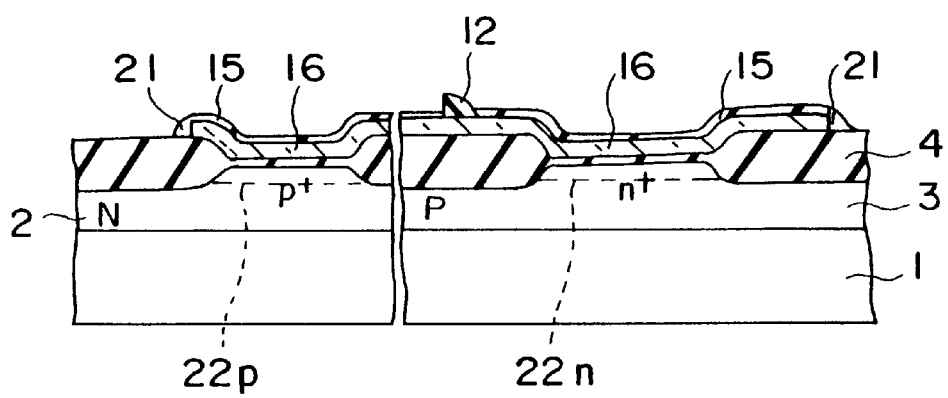

Next, the description is directed to the patterning of the dual gates of the MOS transistors. The silicon layer 9 and the SiO$_2$ film 15 overlying it are patterned by photolithography as illustrated in FIG. 3C and FIG. 4E. Two dual gate patterns 16 and 17 are separately formed in the form of stripes passing through the first active region 5 and the second active region 6. These stripe patterns 16 and 17 are formed in order to intersect the lateral line of the "T" of the first active region 5 at a right angle and the lower line of the "U" of the second active region 6.

When the dual gate patterns 16 and 17 are formed, a word line pattern 18 is formed, at the same time, passing over the two parallel lines of the "U" of the second active region 6 and extending in the direction perpendicular to the dual gate patterns 16 and 17.

The portions of the dual gate patterns 16 and 17 overlying the first active region 5 serve as the gate electrodes of the load transistors Q$_1$ and Q$_2$ as illustrated in FIG. 1. Also, the portions of the dual gate patterns 16 and 17 overlying the second active region 6 serve as the gate electrodes of the drive transistors Q$_3$ and Q$_4$. Furthermore, the portions of the word line pattern 18 overlying the second active region 6 serve as the gate electrodes of the transfer transistors Q$_5$ and Q$_6$.

The word line pattern 19 as illustrated in FIG. 3C is the word line pattern of other SRAM cells and passes across the active regions of the other SRAM cells continuously arranged in the second active region.

Next, the description is directed to the formation of the source region and the drain region of the MOS transistors having LDD structure.

As illustrated in FIG. 4E, a p-type impurity such as boron is introduced into the first active region 5 to form shallow p-type impurity diffusion layers 20p defining a source region and a drain region. The impurity concentration in them is $1\times10^{18}$ to $1\times10^{19}$ atoms/cm$^3$ respectively. Furthermore, an n-type impurity such as arsenic or phosphorus is ion-implanted into the second active region 6 to form shallow n-type impurity diffusion layers 20n. The impurity concentration is $1\times10^{18}$ to $1\times10^{19}$ atoms/cm$^3$. When these p-type and n-type impurities are ion-implanted, the field insulating film 4, the dual gate patterns 16 and 17 and the word line patterns 18 and 19 are used as a mask.

Next, after forming an insulating film made of such as SiO$_2$ on the entirety by CVD to a thickness of 1000 Å, insulating sidewalls 21 are formed on the sides of the field insulating film 4, the dual gate patterns 16 and 17 and the word line patterns 18 and 19 by removing this insulating film approximately in the vertical direction by reactive ion etching (RIE). By this process, the dual gate patterns 16 and 17 and the word line patterns 18 and 19 are flanked with insulating films.

With this structure, a p-type impurity such as boron is introduced into the first active region 5 to form deep p-type impurity diffusion layers 22p with the dual gate patterns 16 and 17, the word line patterns 18 and 19, the field insulating film 4 and the insulating sidewalls 21 as a mask. Also, with the same mask, an n-type impurity such as phosphorus is ion-implanted into the second active region 6 to form deep n-type impurity diffusion layers 22n. In this case, the impurity concentration of the p-type impurity diffusion layers 22p and the n-type impurity diffusion layers 22n is $1\times10^{20}$ atoms/cm$^3$ respectively.

When the p-type impurity and the n-type impurity are separately ion-implanted, a photoresist pattern (not shown) is used as a mask.

Source and drain regions are formed by the n-type impurity diffusion layer 20n and 22n and the p-type impurity diffusion layer 20p and 22p, resulting in the completion of the formation of the MOS transistors. With this structure, the load transistors Q$_1$ and Q$_2$, the drive transistors Q$_3$ and Q$_4$ and the transfer transistors Q$_5$ and Q$_6$ are located in the first active region 5 and the second active region 6 as illustrated in FIG. 3D.

Afterward, the sidewall 12 of silicon nitride on the dual gate patterns 16, 17 is removed with a hot phosphoric acid, so that a opening 23 is formed to expose the silicon layer 9 of the dual gate patterns 16, 17. Besides, the removal of the sidewall 12 may be performed immediately after forming the SiO$_2$ by oxidizing a surface of the silicon layer 9.

Next, the description is directed to the formation of silicide layers on the surface of the silicon layer by the salicide technique.

Figure 4G:
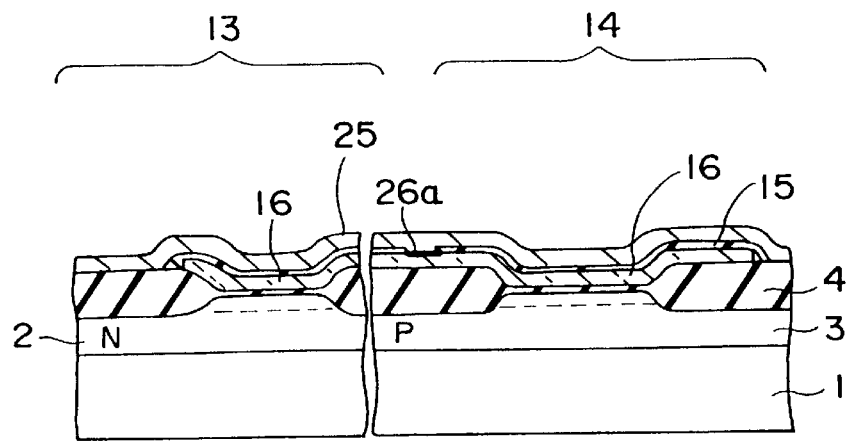
Figure 4H:
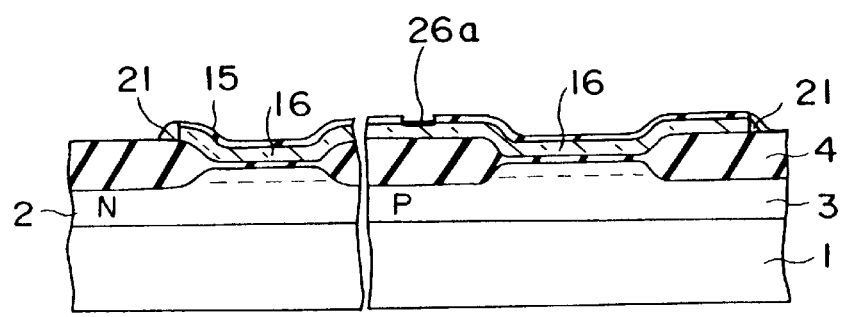
Figure 4I:
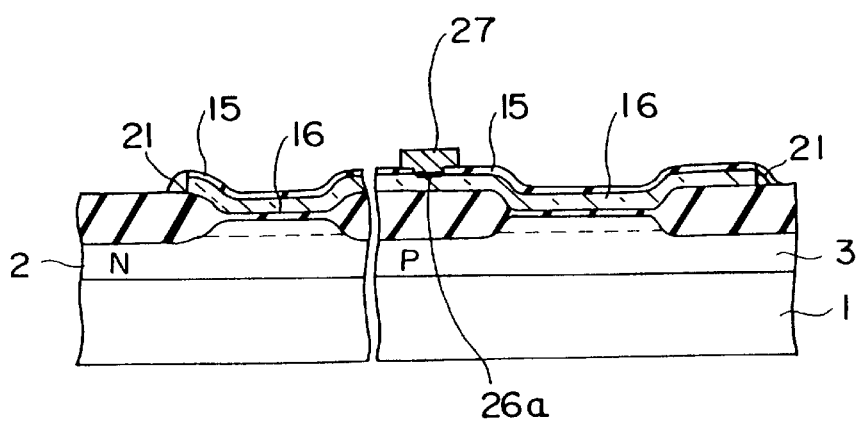
Figure 5A:
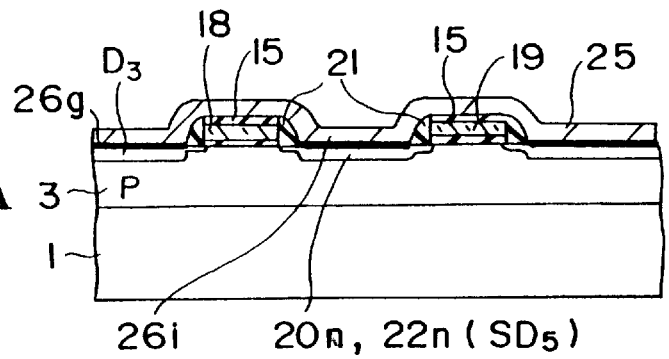
FIGS. 5A through 5D are cross sectional views showing the manufacturing method along II—II line of FIG. 3A in accordance with the first embodiment of the present invention.
Figure 5B:
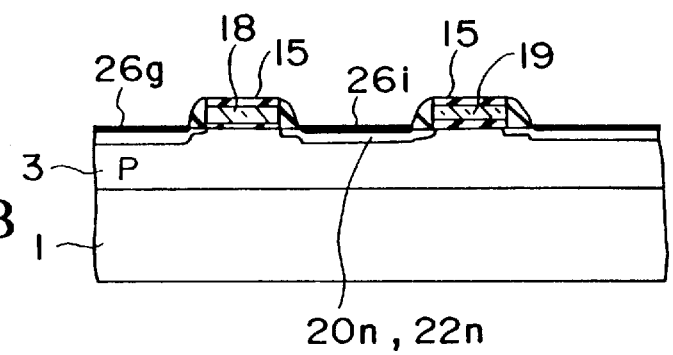

After formation of a metallic film 25 made of Co, Ti, Ni or the like covering the respective transistors, as illustrated in FIG. 4G and FIG. 5A, the metallic film 25 is heated at 600 to 700° C. By this process, as illustrated in FIG. 3E, FIG. 4G and FIG. 5A, metal silicide layers 26a to 26j are formed on the surfaces of the silicon layer 9 forming the dual gate patterns 16 and 17 and exposed through the opening 23 and on the surfaces of the first and second active regions 5 and 6 (source/drain regions) which are not covered by the dual gate patterns 16 and 17 and the word line patterns 18 and 19. Meanwhile, in case of using Ti, Co or Ni as the metallic film 25, the metal silicide layers 26a to 26j are made of TiSi, CoSi or NiSi respectively. Thereafter, as illustrated in FIG. 4H and FIG. 5B, the metallic film 25 having not reacted with silicon is removed by wet etching with a mixed liquid of H$_2$O$_2$+H$_2$SO$_4$. Another thermal treatment may be carried out in addition, if necessary.

By this process, the p-type impurity region 13 and the n-type impurity region 14 in the dual gate patterns 16 and 17 are connected to each other through the silicide layers 26a and 26b to complete the formation of the dual gate structure.

Next, the description is directed to the formation of local interconnections for connecting the MOS transistors to each other and the formation of contact pads for connection with power lines, bit lines and so forth.

A conductive film 24 made of TiW, TiN, W, polycide, silicide or the like is formed over the MOS transistors and patterned by photolithography.

Figure 5C:
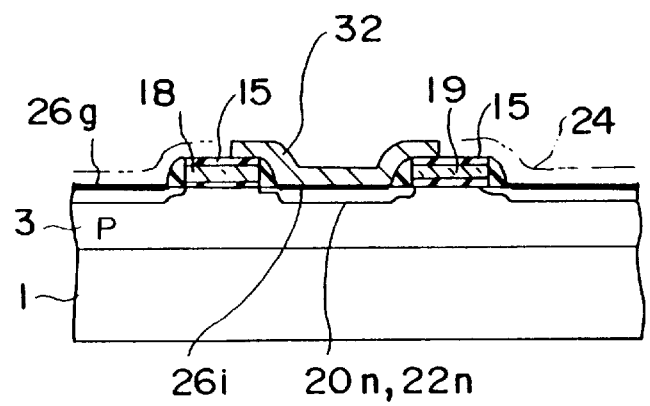

By this process, as illustrated in FIG. 3F, the drain regions D$_1$(D$_2$) of the load transistor Q$_1$(Q$_2$) and the drain regions $D_1(D_2)$ of the drive transistors $Q_3(Q_4)$ are connected to each other by means of interconnections 27(28) in order to form a couple of CMOS invertors. In addition to this, the interconnections 27(28) is extended, over the dual gate pattern 17(16) of the associated CMOS invertor, to the silicide layer 26b(26a) of the dual gate patterns 16(17) of the adjacent CMOS invertor for cross-coupling. At the same time, as illustrated in FIG. 5C, contact pads 30 to 33 are formed on the common source region $S_{1\,2}$ of the two load transistors $Q_1$ and $Q_2$ and therearound, the common source region $S_{3\,4}$ of the two drive transistors $Q_3$ and $Q_4$ and therearound, and the source/drain regions $SD_5$ and $SD_6$ of the transfer transistors $Q_5$ and $Q_6$ and therearound, to which the bit lines BL and $\overline{BL}$ are connected.

While these contact pads 30 to 33 partially overlap the dual gate patterns 16 and 17 and the word line patterns 18 and 19, they are not in direct contact with each other. This is because the dual gate patterns 16 and 17 and the word line patterns 18 and 19 are covered with the insulating films 15 and 21.

After six MOS transistors of a SRAM cell and interconnections combining them each other are completed through above processes, the description is directed to the connection with bit lines and power lines.

Figure 5D:
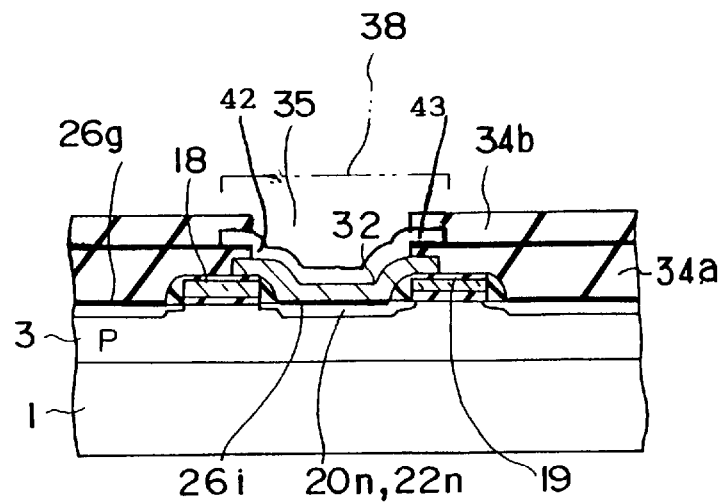

As illustrated in FIG. 5D, after coating the CMOS transistors with a first interlayer insulating film 34a, contact holes 42 are opened through the first interlayer insulating film 34a by patterning. In this case, since the contact pad 32 is formed under the area where the contact holes 42 is to be formed and since part of the contact pad 32 is connected to the source/drain regions $SD_5$ and $SD_6$, there is secured margins of aligning the mask for formation of the contact holes 42 and the like.

Next, a first metallic film made of such as tungsten, aluminum is formed by sputtering and patterned to form a power line 43.

The power line 43 is then coated with a second interlayer insulating film 34b. Thereafter, the second interlayer insulating film 34b is patterned to form the contact hole 35 for making connection with either of the two source/drains of n-channel transfer transistors $Q_5$ and $Q_6$ to be connected to the bit line BL and $\overline{BL}$.

After forming the contact hole 35, a second metallic film is formed on the second interlayer insulating film 34b and in the contact hole 35. The second metallic film is then patterned to from the bit line 38 and connected to the source/drain regions $SD_5$ and $SD_6$ of the transfer transistors through the contact hole 35.

Meanwhile, a Vss power line is formed from the above described first metallic film on the common source region $S_{3\,4}$ of the two drive transistors $Q_3$ and $Q_4$ through the contact hole 36. A Vcc power line is formed from the above described first metallic film on the common source/drain regions $S_{1\,2}$ of the transfer transistors $Q_5$ and $Q_6$ through the contact hole 37 in the same manner as illustrated in FIG. 3F.

Since the above described contact pads 30 and 31 are formed under these contact holes 36 and 37, there is secured margins of aligning the contact holes 36 and 37.

Incidentally, as described above, since the silicide layers 26a and 26b on the upper surface of the dual gate patterns 16 and 17 are formed in the narrow area from which the sidewall 12 is removed, the area of the silicide layers 26a and 26b is extremely small, i.e., on the order of 0.2×0.3 μm. As a result, there is no problem if the distance between the first active region 5 and the second active region 6 is decreased by the amount corresponding to the decreased area of the silicide layers 26a and 26b. This helps to improve the integration level of SRAM cells.

It may be considered to form the oxidation resisting pattern on the silicide layers 26a and 26b of the dual gate patterns 16 and 17 by photolithography. However, when photolithography is employed, an additional process must be carried out for formation of a resist pattern so that a margin must be secured for aligning a photomask and the like, resulting in the increase of the pattern in size. On the other hand, in the case that the formation of the dual gates is not indispensable, this method becomes effective when the single gate structure is employed.

Although formation of only one SRAM cell is explained in the above description, a large number of SRAM cells are formed in the entire semiconductor memory device.

Also, although the silicon layer 9 on the first active region 5 is exposed by patterning the BSG film 10 in the above description, the silicon layer 9 on the first active region 5 is exposed by patterning a PSG film formed in place of the BSG film 10. In this case, while phosphorus is diffused from the PSG film to the silicon layer 9, B or BF2 ions are introduced and furthermore diffused to the silicon layer 9 which is not coated with the PSG film. In this case, the PSG film is flanked with the sidewall 12.

(Second Embodiment)

It may be the case that the area of the sidewall 12 is not sufficient when the silicide layers 26a and 26b are formed in the boundary area between the p-type impurity region 13 and the n-type impurity region 14 of the dual gate patterns 16 and 17 in which interdiffusion between the p-type impurity and the n-type impurity is substantial. In such a case, the following process can be employed.

Figure 6A:
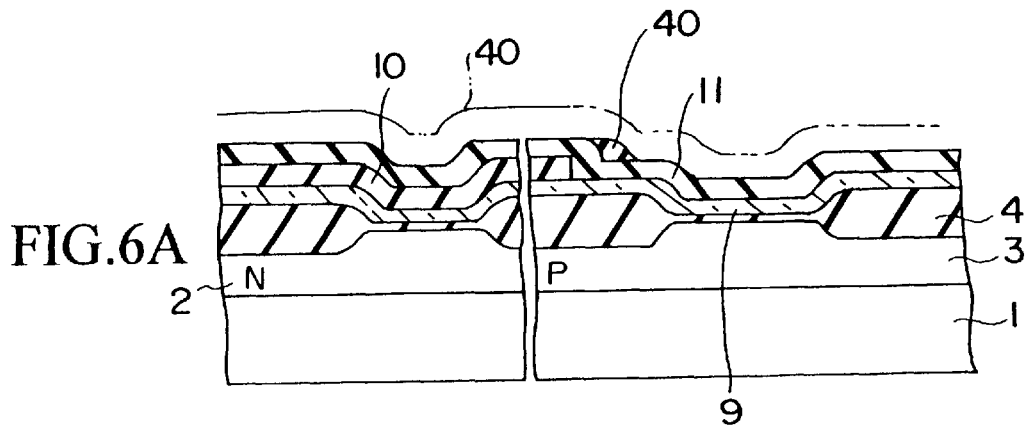
FIGS. 6A through 6D are cross sectional views showing a method of manufacturing SRAM cells provided with dual gates in accordance with a second embodiment of the present invention.

With the structure as illustrated in FIG. 4B by the above described manufacturing method, the silicon nitride film 11 is deposited on the BSG film 10 and the silicon layer 9 as illustrated in FIG. 6A. Furthermore, an appropriate film having an etching selective ratio different from that of the silicon nitride film 11, for example, a PSG film 40 is formed on the silicon nitride film 11. The thickness of the PSG film 40 is chosen to be about double the diffusion length of the p-type impurity and the n-type impurity respectively, for example, 5000 Å. Since the PSG film 40 has a small stress, no adverse influence is expected even if the thickness thereof is increased.

Figure 6B:
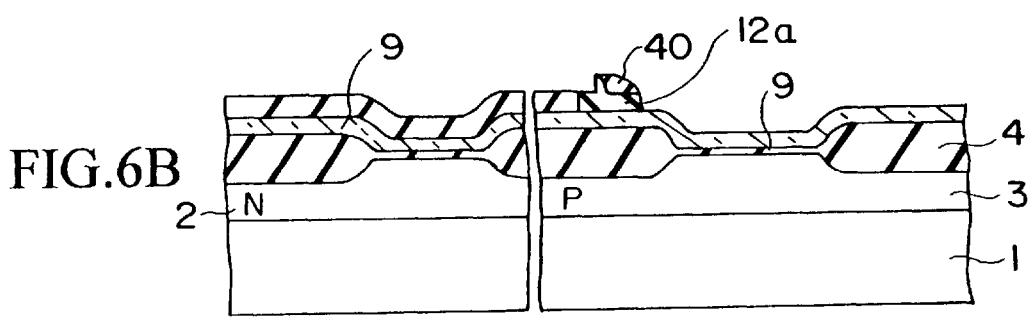

Next, as illustrated in FIG. 6B, the PSG film 40 is subjected to anisotropic etching approximately in the vertical direction in order to leave the PSG film 40 only on the step of the silicon nitride film 11 formed near the peripheral of the BSG film 10. The silicon nitride film 11 is then etched with the patterned PSG film 40 as a mask to form a sidewall 12a at the periphery of the BSG film 10 as illustrated in FIG. 6B.

Figure 6C:
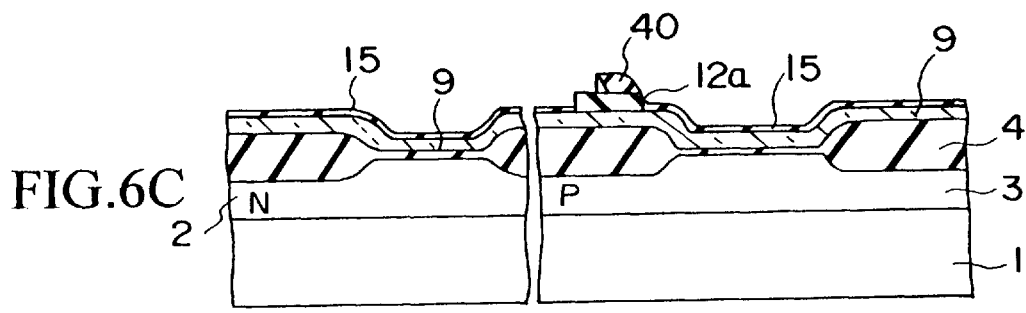

After this, in accordance with the process as described in the above for the first embodiment, the p-type impurity region 13 and the n-type impurity region 14 are formed by introducing impurities into the silicon layer 9, followed by removing the BSG film 10. The surface of the silicon layer 9 which is not coated with the sidewall 12a is oxidized to form the $SiO_2$ film 15 as illustrated in FIG. 6C.

Figure 6D:
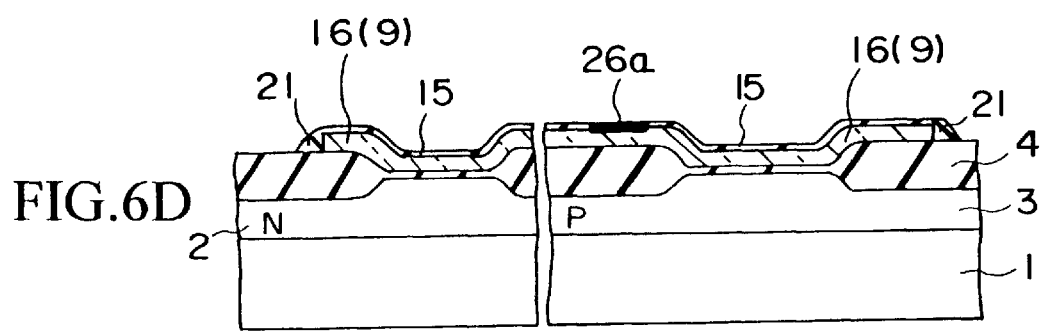

Sequentially, the dual gate patterns 16 and 17 are formed by patterning the silicon layer 9, followed by removing the sidewall 12a. Alternatively, the formation of the dual gate patterns 16 and 17 may be performed after removal of the sidewall 12a. The silicide layer 26a is then formed on the exposed surface of the silicon layer 9 in accordance with the process as described in the above for the first embodiment as illustrated in FIG. 6D.

Meanwhile, the sidewall 12a thus formed is enlarged toward the second active region 6 as compared with the sidewall 12 of the first embodiment. With this structure, the silicide layers 26a and 26b on the dual gate patterns 16 and 17 become wide. As a result, even if the diffusion length of the p-type impurity and the n-type impurity is large, the electrical connection between the p-type impurity region 13 and the n-type impurity region 14 can be made sure since the silicide layers 26a and 26b are making in contact with the highly doped regions of the p-type impurity region 13 and the n-type impurity region 14.

(Third Embodiment)

Although the contact pads 30 to 33 are formed on the source regions or the drain regions of the MOS transistors in the above description, the following process can be employed when such contact pads 30 to 33 are not formed.

Figure 7A:
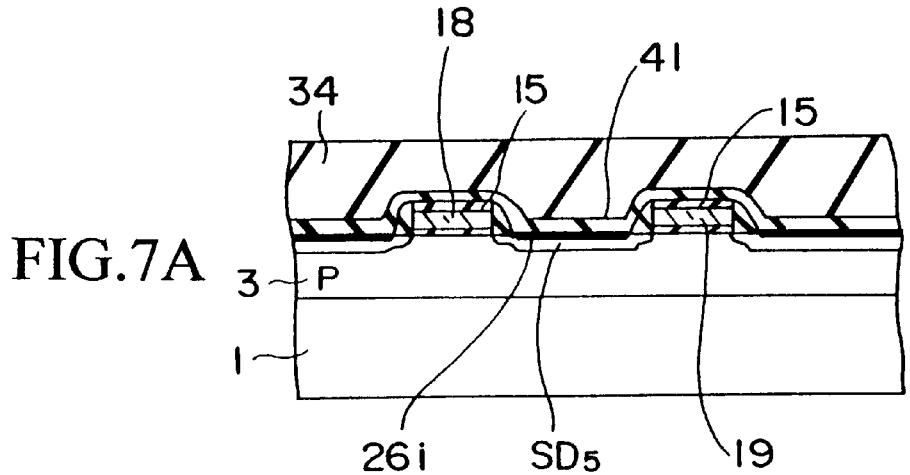
FIGS. 7A through 7C are cross sectional views showing a method of manufacturing SRAM cells provided with dual gates in accordance with a third embodiment of the present invention.

First, after making connection among the load transistors $Q_1$ and $Q_2$ and the drive transistors $Q_3$ and $Q_4$, all the MOS transistors are covered with an aluminum oxide ($Al_2O_3$) film 41, as illustrated in FIG. 7A, followed by forming the interlayer insulating film 34 made of SOG.

Figure 7B:
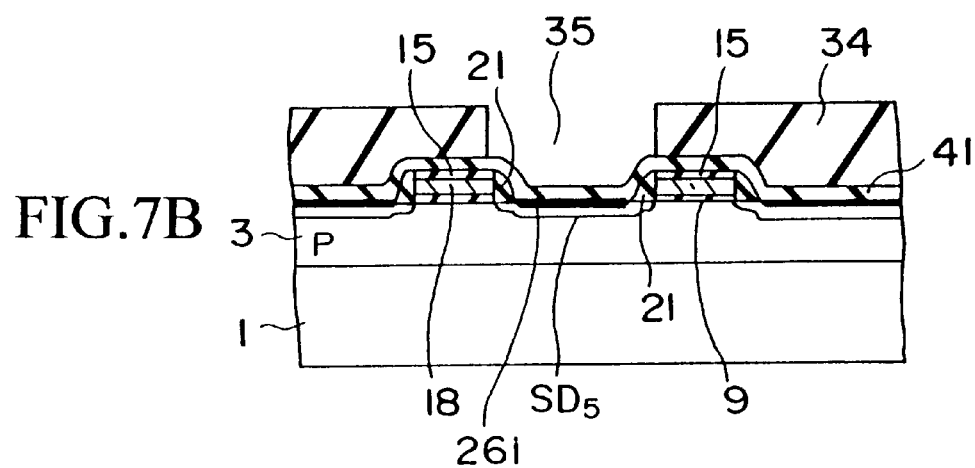

Next, the contact hole 35 is formed on the interlayer insulating film 34, as illustrated in FIG. 7B. Since the interlayer insulating film 34 is more selective during etching than aluminum oxide, the insulating films 15 and 21 covering the word line patterns 18 and 19 and the dual gate patterns 16 and 17 are not removed during the formation of the contact hole 35.

Figure 7C:
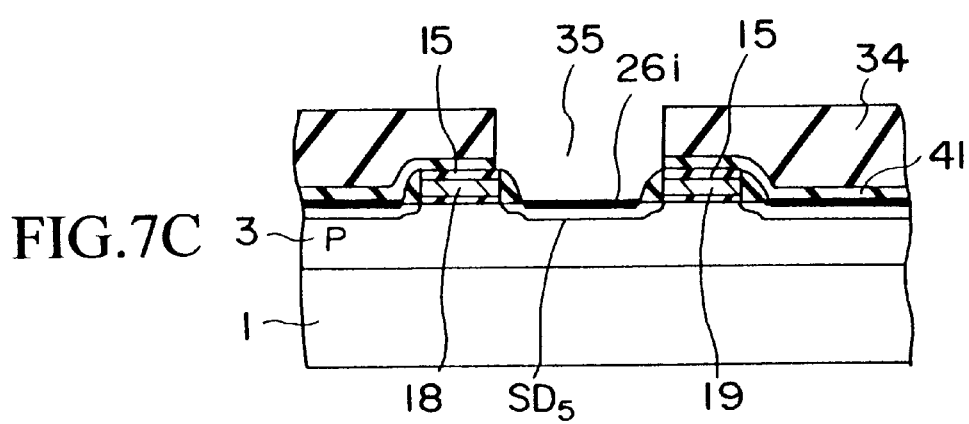

The source/drain region $SD_5$ appears when the aluminum oxide film 41 exposed through the contact hole 35 is selectively removed by sputtering etching as illustrated in FIG. 7C.

Meanwhile, when a silicon nitride film is utilized in place of the aluminum oxide film 41, the similar effects are obtained.

(Other Embodiments)

The above described contact pads 30 to 33 may be patterned together with the interconnections connected to the dual gate pattern and therefore independent upon the formation process of the dual gate pattern.

The contact pads 30 to 33 may therefore be patterned at the same time as the interconnections to be connected to the dual gate pattern is patterned, after the formation of the dual gate pattern in accordance with a conventional process. The above described opening 23 may be formed by a conventional photolithographic technique too.

Also, the above described process for forming the dual gate structure is applicable not only to the CMOS of the SRAM cells but also to CMOS gates of other semiconductor devices.

As described above, in accordance with an embodiment of the present invention, the width of the area for forming silicide layers is extremely narrowed since the silicide formation area of the silicon layer 9 is procured by the oxidation resisting sidewall 12 formed in a self-aligned fashion. By this structure, it is possible to decrease the size of the dual gate and to fine SRAM cells.

In addition to this, since the oxidation resisting sidewall 12 formed in a self-aligned fashion is utilized as the mask for ion-implantation of impurity ions into the silicon layer 9 and the oxidation resisting mask for thermally oxidizing a part of the surface of the silicon layer 9, the throughput is improved as compared with the case that masks are formed by photolithography.

Furthermore, according to another embodiment of the present invention, since it is performed by patterning one conductive film to form the contact pads 30 to 33 located in the area where the contact holes 42, 36 and 37 are to be formed and the interconnections 27 and 28 to be connected to the silicide layers 26a and 26b at the surface of the dual gate patterns 16 and 17 of the MOS transistors. In this case, since the silicide layers 26a and 26b are located apart from the contact pads 30 to 33, it becomes possible to prevent the formation of a short circuit connecting them, to dispense with an additional process for forming the contact pads 30 to 33 and to make use of the self-aligned process for aligning the position of contact holes on the source/drain layers.

What is claimed is:

1. A method for manufacturing a semiconductor device comprising:

forming a field insulating film (4) on a surface of a first semiconductor layer (2) containing an impurity of a first conductivity type to define a first active region (5);

forming said field insulating film (4) on a surface of a second semiconductor layer (3) containing an impurity of a second conductivity type to define a second active region (6);

forming gate insulating films (7,8) respectively on the surfaces of said first semiconductor layer (2) within said first semiconductor layer (2) and said second semiconductor layer (3) within said second active region (6);

forming a third semiconductor layer (9) doped with no impurity, on said gate insulating films (7,8) and said field insulating film (4);

forming a first insulating film (10) containing said impurity of said second conductivity type on said third semiconductor layer (9);

patterning said first insulating film (10) to form a pattern in which a periphery of said first insulating film (10) is located between said first active region (5) and said second active region (6) and to expose a surface of said second semiconductor layer (3) of said second active region (6);

forming an oxidation resisting second insulating film (11) on said patterned first insulating film (10) and said second semiconductor layer (3);

forming an oxidation resisting sidewall (12, 12a) by anisotropic etching said second insulating film (11) to leave said second insulating film (11) on a side of said first insulating film (10);

introducing said impurity of said first conductivity type into said third semiconductor layer (9) of said second active region (6) with said first insulating film (10) and said oxidation resisting sidewall (12,12a) as a mask;

diffusing said impurity of said second conductivity type contained in said first insulating film (10) into said third semiconductor layer (9) underlying said first insulating film (10) and activating said impurity of said second conductivity type contained in said third semiconductor layer (9);

forming an insulating film (15) by thermally oxidizing the surface of said third semiconductor layer (9);

partially exposing said third semiconductor layer (9) by removing said oxidation resisting sidewall (12,12a);

patterning the third semiconductor layer (9) and the layers thereon to form gate electrode patterns (16,17) which extend from a part on the first active region (5) to a part on the second active region (6) and serve as gate electrodes of a MOS transistor; and forming a silicide layers (26a, 26b) on the surface of said semiconductor layers.

2. The method for manufacturing a semiconductor device as claimed in claim 1 further comprising:

forming source regions ($S_1,S_2$) and drain regions ($D_{1\ 2}$) of said second conductivity type of first and second MOS transistors ($Q_1, Q_2$) by ion-implanting and diffusing said impurity of said second conductivity type into said first semiconductor layer (2) of said first active region (5) with said gate electrode patterns (16,17) as a mask; and forming source regions ($S_3,S_4$) and drain regions ($D_{3\ 4}$) of said second conductivity type of third and fourth MOS transistors ($Q_3,Q_4$) by ion-implanting and diffusing said impurity of said first conductivity type into said first semiconductor layer (2) of said second active region (6) with said gate electrode patterns (16,17) as a mask.

3. The method for manufacturing a semiconductor device as claimed in claim 1, wherein said gate electrode patterns (16,17) is flanked with an insulating sidewalls (21), and said source regions ($S_1,S_2, S_3,S_4$) and said drain regions ($D_{1\ 2}, D_{3\ 4}$) are formed with LDD structures by ion-implanting said impurity of said first conductivity type and said impurity of said second conductivity type twice before and after formation of said insulating sidewalls (21).

4. The method for manufacturing a semiconductor device as claimed in claim 1 further comprising:

forming a third insulating film (40) on said second insulating film (11) in advance of forming said oxidation resisting sidewall (12a) and selectively leaving said third insulating film (40) on a step of said second insulating film (11) along a periphery of said first insulating film (10); and forming said oxidation resisting sidewall (12a) of said second insulating film (11) in an area extending from a periphery of said first insulating film (10) to said third insulating film (40) by anisotropic etching said second insulating film (11) with said third insulating film (40) as a mask.

5. The method for manufacturing a semiconductor device as claimed in claim 1 further comprising:

coating said gate electrode patterns (16,17) located apart from each other and said first and second active regions (5,6) with a conductive film (24) made of a material different from that of said silicide layers (26a,26b); and forming a first interconnection (27) extending from said silicide layers (26a) on one (16) of said gate electrode patterns to said first and second active regions (5,6) in the side of the other (17) of said gate electrode patterns over said insulating film (15) on the other (17) of said gate electrode patterns and a second interconnection (28) extending from said silicide layers (26b) on the other (17) of said gate electrode patterns to said first and second active regions (5,6) in the side of the one (16) of said gate electrode patterns over said insulating film (15) on the one (16) of said gate electrode patterns.

6. The method for manufacturing a semiconductor device as claimed in claim 1 wherein a contact pad (32) is formed in an area of said first and second active regions (5,6) to be connected to an upper interconnection (36) and therearound during patterning said conductive film (24).

7. The method for manufacturing a semiconductor device as claimed in claim 1:

wherein first and second MOS transistors ($Q_1,Q_2$) are formed from said gate electrode patterns (16,17), source regions ($S_1,S_2$) and drain regions ($D_{1\ 2}$) formed in both sides of said two gate electrode patterns (16,17);

wherein third and fourth MOS transistors ($Q_3,Q_4$) of said second conductivity type are formed from said gate electrode patterns (16,17), source regions ($S_3,S_4$) and drain regions ($D_{3\ 4}$) formed in both sides of said two gate electrode patterns (16,17); and wherein a flip-flop circuit is formed from said first to fourth MOS transistors ($Q_1,Q_2,Q_3,Q_4$) by means of said first and second interconnections (27,28).

8. The method for manufacturing a semiconductor device as claimed in claim 1 wherein said third semiconductor layer (9) is formed from one of polycrystalline and amorphous silicon.

9. The method for manufacturing a semiconductor device as claimed in claim 1 wherein said silicide layers (26a,26b) are formed from a material selected among from a group consisting of titanium silicide, cobalt silicide, nickel silicide formed by salicide.

10. The method for manufacturing a semiconductor device as claimed in claim 1 wherein said silicide layers (26a,26b) are formed from an alloy including a refractory metal.

11. A method for manufacturing a semiconductor device comprising:

forming a field insulating film on a surface of a semiconductor layer surrounding a first region to be formed of a first MOS transistor and a second region to be formed of a second MOS transistor;

forming a gate insulating film on said surface of said semiconductor layer in said first and second regions;

forming a gate electrode layer on said gate insulating layer over said field insulating layer;

forming a gate covering insulating film on said gate electrode layer;

forming an opening in a part of said gate cover insulating film;

patterning said gate covering insulating film and said gate electrode layer to determine a gate, a source and a drain of said first MOS transistor and a gate, a source and a drain of said second MOS transistor;

forming a sidewall spacer to said gate of said first MOS transistor and said gate of said second MOS transistor;

introducing first conductive type impurity into said source and drain of said first MOS transistor;

introducing second conductive type impurity into said source and drain of second MOS transistor;

forming a first silicide layer on said gate in said opening of said gate covering insulating film and a second silicide layer on said source and said drain of said first MOS transistor and a third silicide layer on said source and drain of said second MOS transistor;

forming a conductive layer on said first silicide layer, said second silicide layer and said third silicide layer over said gate covering insulating film, said sidewall spacer and said field insulating film;

patterning said conductive layer to make a lower interconnect from said first silicide layer to said second silicide layer and to make a contact pad on said third silicide layer over said sidewall spacer and said gate covering insulating film;

forming an interlevel insulator on said gate covering insulating film, said sidewall spacer, said first, second and third silicide layer, said conductive layer and said field insulating layer;

forming a contact hole in said interlevel insulator so as to expose said contact pad; and forming an upper interconnect layer on said interlevel insulator connected to said contact pad electrically through said contact hole.

12. The method for manufacturing a semiconductor device as claimed in claim 11, wherein said silicide layer is formed by Salicide (self-aligned silicide) process.

13. The method for manufacturing a semiconductor device as claimed in claim 11, wherein said conductive layer is made of one selected from a group consisting of tungsten, titanium nitride, titanium tungsten, titanium, titanium nitride, polycide and silicide.

14. The method for manufacturing a semiconductor device as claimed in claim 11, wherein said gate electrode layer consists a first conductivity impurity containing region and a second conductivity impurity containing region, said first silicide layer forms a short-circuit connecting said first conductivity impurity containing region and said second conductivity impurity containing region.

* * * * *